(12) United States Patent
Elkaslassy et al.

(10) Patent No.: US 8,929,081 B2
(45) Date of Patent: Jan. 6, 2015

(54) HEAT DISSIPATING HIGH POWER SYSTEMS

(75) Inventors: Daniel Elkaslassy, Zikron Yahakov (IL); Daniel Kalmanoviz, Kiryat Tivon (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 134 days.

(21) Appl. No.: 13/417,905

(22) Filed: Mar. 12, 2012
(Under 37 CFR 1.47)

(65) Prior Publication Data
US 2012/0314374 A1 Dec. 13, 2012

Related U.S. Application Data

(60) Provisional application No. 61/451,771, filed on Mar. 11, 2011, provisional application No. 61/499,949, filed on Jun. 22, 2011.

(51) Int. Cl.
H05K 7/20 (2006.01)
H05K 1/18 (2006.01)
H05K 1/02 (2006.01)

(52) U.S. Cl.
CPC ............... *H05K 1/181* (2013.01); *H05K 7/209* (2013.01); *H05K 1/0203* (2013.01); *H05K 2201/10371* (2013.01)
USPC ........... 361/720; 361/709; 361/760; 257/712; 174/252; 174/548

(58) Field of Classification Search
USPC ......... 361/676–678, 688–722, 752, 760–761, 361/783, 831
See application file for complete search history.

(56) References Cited

U.S. PATENT DOCUMENTS

| | | | | |
|---|---|---|---|---|
| 5,812,374 A * | 9/1998 | Shuff | ............................ | 361/704 |
| 5,930,115 A * | 7/1999 | Tracy et al. | .................... | 361/704 |
| 6,049,469 A * | 4/2000 | Hood et al. | .................... | 361/818 |
| 6,356,448 B1 * | 3/2002 | DiBene et al. | ................ | 361/721 |
| 7,375,974 B2 * | 5/2008 | Kirigaya | ....................... | 361/752 |
| 7,474,185 B2 * | 1/2009 | Hooey et al. | ..................... | 336/55 |
| 7,623,349 B2 * | 11/2009 | Refai-Ahmed et al. | ...... | 361/719 |
| 2003/0198022 A1 * | 10/2003 | Ye et al. | ........................ | 361/719 |
| 2006/0012034 A1 * | 1/2006 | Kadoya et al. | ................ | 257/712 |
| 2009/0119913 A1 * | 5/2009 | Mayuzumi et al. | ............. | 29/841 |

* cited by examiner

Primary Examiner — Courtney Smith

(57) ABSTRACT

An electronic system includes a printed circuit board (PCB), and a heat dissipating element. The PCB includes one or more first electronic components mounted on a first side of the PCB, and one or more second electronic components mounted on a second side of the PCB. The first electronic components have a power consumption that is greater than a threshold and have a height over the first side of the PCB that is higher than any other electronic components mounted on the first side of the PCB. At least one of the second electronic components has a height over the second side of the PCB that is higher than the height of the first electronic components. The heat dissipating element is adjacent to the first electronic components so as to provide a thermal coupling for dissipating heat generated by the first electronic components.

18 Claims, 4 Drawing Sheets

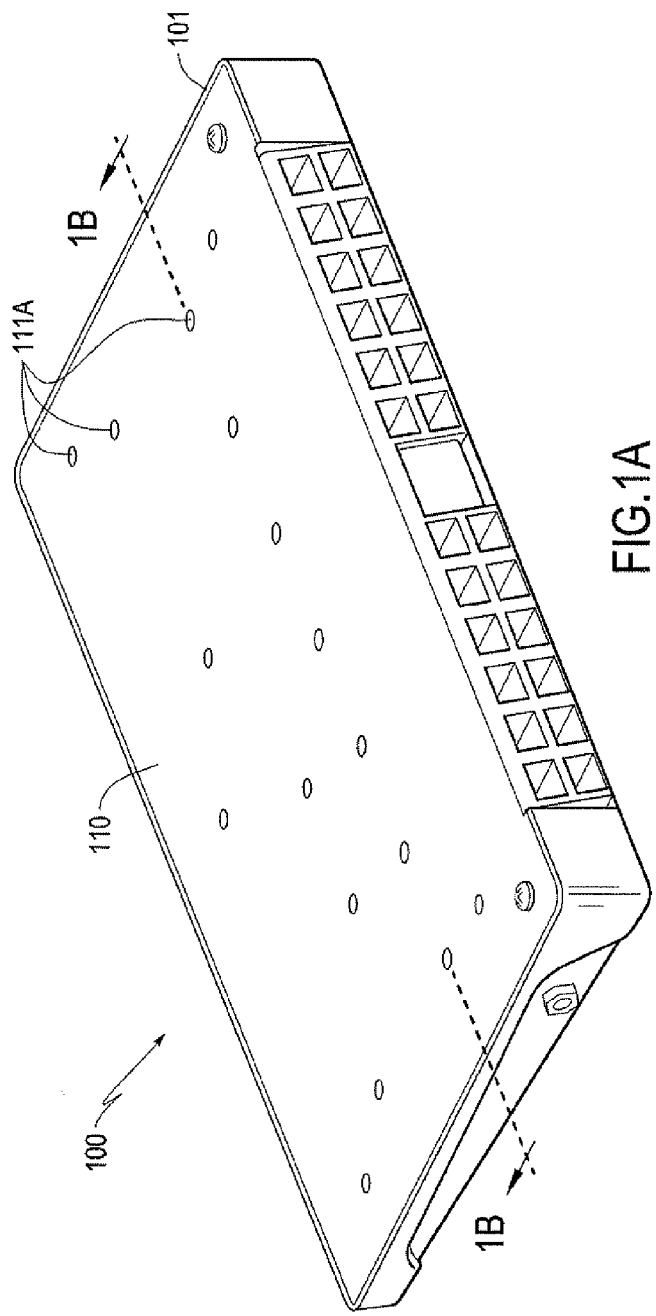
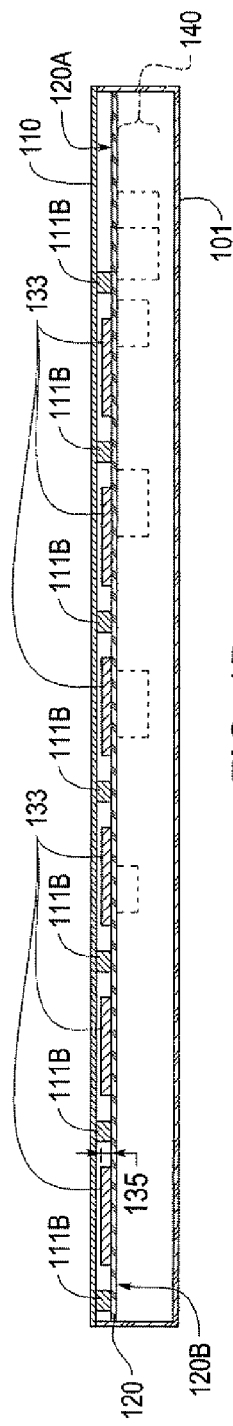
FIG. 1A
FIG. 1B

HEAT DISSIPATING HIGH POWER SYSTEMS

INCORPORATION BY REFERENCE

This present disclosure claims the benefit of U.S. Provisional Applications No. 61/451,771, "Low Cost Thermal Design for High Power Systems" filed on Mar. 11, 2011, and No. 61/499,949, "Low Cost Thermal Design for High Power Systems" filed on Jun. 22, 2011, which are incorporated herein by reference in their entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In conventional electronic systems, placement of electronic components is determined by various matters related to economy, timing, signal integrity and the like. However, various electronic systems that consume relatively large power require a cooling mechanism to dissipate heat generated by the electronic components in order to maintain the temperature of various electronic components, as well as of the entire system, within an acceptable range. Cooling mechanisms can include, for example, a heat sink for high power consumption components as well as even fans that create a forced air flow through the system.

SUMMARY

Aspects of the disclosure provide an electronic system. The electronic system includes a printed circuit board (PCB), and a heat dissipating element. The PCB includes one or more first electronic components mounted on a first side of the PCB, and one or more second electronic components mounted on a second side of the PCB. The first electronic components have a power consumption that is greater than a threshold and have a height over the first side of the PCB that is higher than any other electronic components mounted on the first side of the PCB. At least one of the second electronic components has a height over the second side of the PCB that is higher than the height of the first electronic components. The heat dissipating element is adjacent to the first electronic components so as to provide a thermal coupling for dissipating heat generated by the first electronic components.

According to aspect of the disclosure, the heat dissipating element is a portion of an enclosure of the electronic system, and the PCB is mounted onto the enclosure with the first side facing the heat dissipating element. In an example, the enclosure is a fan-less enclosure.

In an embodiment, the heat dissipating element is in contact with the first electronic components. The heat dissipating element has a relatively high heat dissipating capability. In an example, the heat dissipating element is a metallic plate.

According to an embodiment of the disclosure, the first electronic components are surface-mount components, and at least one of the first electronic components is an integrated circuits (IC) chip. Further, in an embodiment, the second electronic components are passive non-IC components. In an example, the power consumption of the first electronic components is higher than any other electronic components on the first side of the PCB or the second electronic components on the second side of the PCB.

Aspects of the disclosure also provide a method. The method includes assembling a printed circuit board (PCB) with a heat dissipating element. The PCB board includes one or more first electronic components mounted on a first side of the PCB and one or more second electronic components mounted on a second side of the PCB. The first electronic components have a power consumption that is greater than a threshold and have a height over the first side of the PCB that is higher than any other electronic components mounted on the first side of the PCB. At least one of the second electronic components has a height over the second side of the PCB that is higher than the height of the first electronic components. The first electronic components are adjacent to the heat dissipating element that provides a thermal coupling for dissipating heat generated by the first electronic components.

BRIEF DESCRIPTION OF THE DRAWINGS

Various embodiments of this disclosure that are proposed as examples will be described in detail with reference to the following figures, wherein like numerals reference like elements, and wherein:

FIGS. 1A and 1B show diagrams of an electronic system 100 according to an embodiment of the disclosure;

DETAILED DESCRIPTION OF EMBODIMENTS

Figure 2:
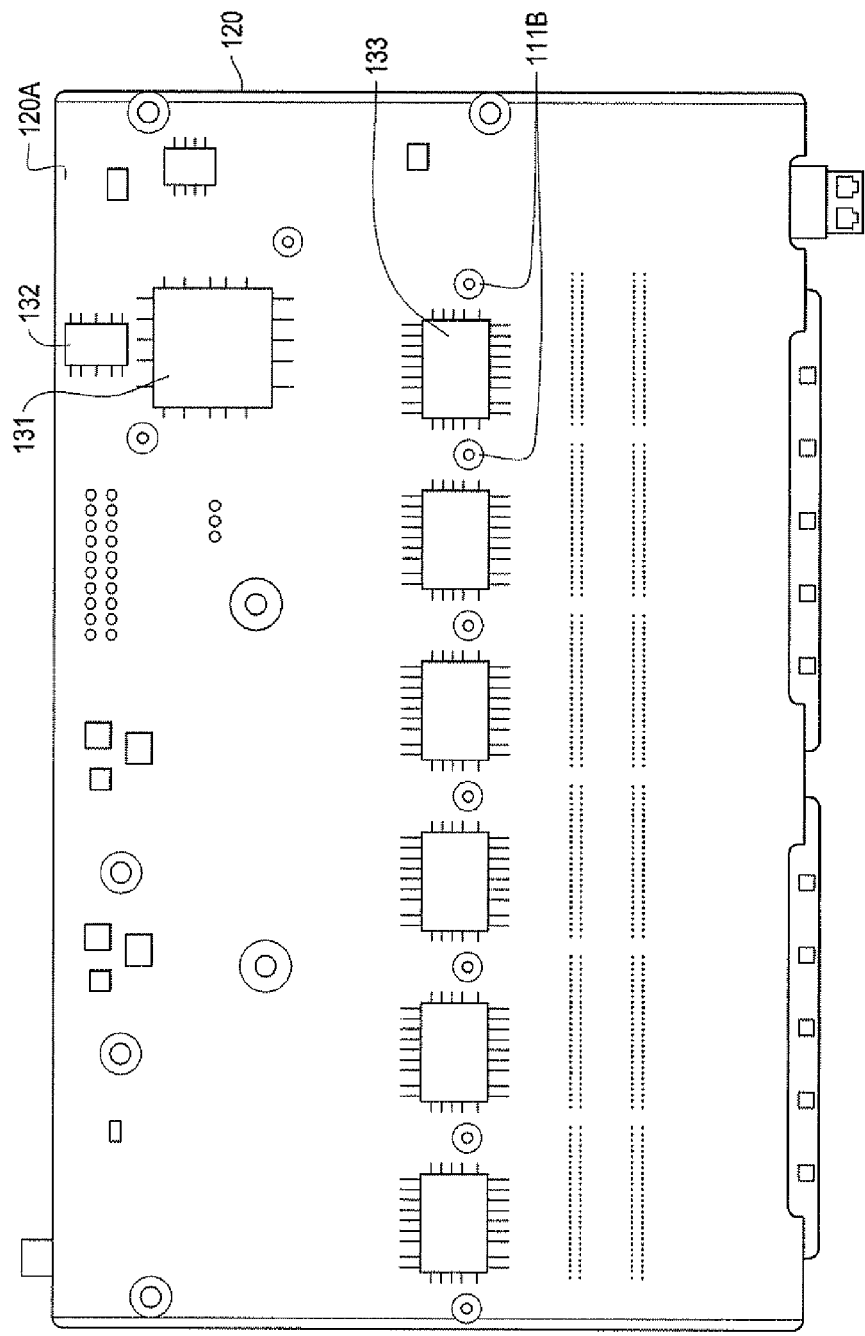
FIG. 2 shows a diagram of a side of a printed circuit board (PCB) 120 according to an embodiment of the disclosure.

FIG. 1A shows a diagram of an electronic system 100 and FIG. 1B shows a cross-section of the electronic system 100, along axis 1B, according to an embodiment of the disclosure. The electronic system 100 includes a printed circuit board (PCB) 120 within an enclosure 101.

The electronic system 100 can include any suitable device, such as a network switching device, a router, a set-top box, a laptop, a server, a desktop, and the like. According to an aspect of the disclosure, a portion of the enclosure 101 is configured to have a relatively high heat dissipation capability to act as a heat sink to dissipate heat generated by the electronic components within the enclosure 101.

In an embodiment, the electronic system 100 is a fan-less system that does not include a fan to create a heat dissipating airflow flowing through the electronic system 100. In an embodiment, the electronic system 100 is arranged such that various high power consuming active heat generating components are disposed on a first side of the PCB 120 that is located in close proximity to a heat dissipating thermal interface element that forms a part of the enclosure 101 of the electronic system 100. The heat dissipating element forms a thermal interface for dissipating heat that is generated inside of the enclosure 101. Similarly, in an embodiment, the electronic system 100 is further arranged such that various low power consuming passive components, which typically generate less heat than the active heat generating components, are disposed on a second side of the PCB 120 that is distanced from the heat dissipating element. By avoiding use of a fan, and by arranging components on a side of a circuit board based on their heat generating characteristics and relative height, so that active high heat generating components can be placed in relatively close proximity to the heat dissipating thermal interface, the electronic system 100 can be implemented with a reduced cost and can be implemented in a relatively slim design.

In another embodiment, in addition to the heat dissipating thermal interface, the electronic system 100 can include a fan (not seen) to additionally dissipate heat generated by the electronic components inside the enclosure 101.

In an embodiment, at least one side of the enclosure 101, such as a planar side 110, has a relatively high thermal conductivity to act as a heat sink. In an example, the planar side 110 is made of metallic material, such as a metal plate, an alloy plate, and the like, to act as a heat sink to dissipate the heat generated inside the enclosure 101 by the electronic components of the electronic system 100. Further, according to an embodiment of the disclosure, as previously noted, the electronic components that consume relatively large power, and typically that generate a comparatively high level of heat, are placed in a relatively close proximity to the planar side 110. This arrangement improves heat dissipation by the planar side 110.

Generally, the PCB 120 includes a first side 120A, for example a top side, and a second side 120B, for example a bottom side, and includes various electronic components mounted on either the first side 120A or the second side 120B. According to an embodiment of the disclosure, electronic components that have relatively large power consumption are mounted on one side of the PCB 120A, such as the first side 120A, and electronic components that have a relatively large height are mounted on another side of the PCB 120, such as the second side 120B. As seen in FIG. 1B, PCB 120 is disposed within the enclosure 101 with the first side 120A having all of the low height components facing the planar side 110. As noted, in an embodiment, the low height electronic components are also high power consumption and high heat generating components. Because all of the electronic components exhibiting relatively low height, high power consumption and high heat generation are disposed on the first side 120A, the distance between the first side 120A and the planar side 110 can thus be made to be relatively small to improve heat dissipation.

In an example, active heat generating components, such as integrated circuit (IC) chips 133, and the like, are mounted on the first side 120A. In an embodiment, when power consumption of an electronic component is larger than a power threshold, such as 1 W, and the like, the electronic component is mounted on the first side 120A. Further, the active heat generating components mounted on the first side 120A have the largest height, such as substantially equal to a height threshold 135. The other components, such as resistors, and the like, mounted on the first side 120A are equal to or lower than the height threshold 135. In an example, the components mounted on the first side 120A are surface mount devices that can be mounted using surface mount technology. In the example, the height threshold is the maximum height of the surface mount devices, for example.

Further, in an embodiment, the electronic components 140 that have a relatively large height, such as larger than the height threshold 135 are mounted on the second side 12013, which in the example of FIG. 1B is the bottom side. In an example, passive electronic components, such as inductor, capacitor, connector, and the like, that have relatively large height, for example higher than the height threshold 135, and do not consume much power, are mounted on the second side 12013.

In an embodiment, the PCB 120 is assembled using a single side assembly that the electronic components on the first side 120A are mounted using surface mount technology and the electronic components on the second side 120B are mounted using through-hole technology, which can be hand assembly for example.

In another embodiment, one or more IC chips, such as IC chips that consume relatively low power, IC chips that have relatively high acceptable temperature range, and the like, are mounted on the second side 120B. The IC chips can be mounted on the second side 120b using surface mount technology or through-hole mount technology.

Further, according to an aspect of the disclosure, the PCB 120 is disposed in the enclosure 101 such that a distance between the first side 120A to the planar side 110 is relatively small, such as generally equal to the height threshold 135. It is noted that the PCB 120 can be disposed in the enclosure 101 using any suitable techniques.

In the FIGS. 1A and 1B example, the PCB 120 is attached to the planar side 110 via attachment parts. The attachment parts have first portions 111A on the planar side 110, and have second portions 11113 on the PCB 120. During an assembling process that assembles the PCB 120 into the enclosure 101, the first portions 111A and the second portions 111B are aligned and attached together to secure the position of the PCB 120 with respect to the enclosure 101. The attachment parts are suitably configured to set the distance between the PCB 120 to the planar side 110. In an embodiment, the attachment parts are suitably configured such that at least some of the IC chips 133 are thermally interfaced with the planar side 110. In an example, the IC chips 133 are in close proximity to the planar side 110, but not in contact with the planar side 110. In another example, the IC chips 133 are substantially in contact with the planar side 110. In still another example, some of the IC chips 133 are in close proximity to the planar side 110 while other IC chips 133 are substantially in contact with the planar side 110.

According to an embodiment of the disclosure, the PCB 120 is a two-layer PCB that minimizes copper usage to reduce bill of material cost. Thus, the PCB 120 has relatively poor heat conductance. In an example, the IC chips 133 on the PCB 120 consume greater power than the other components, such as resistors, capacitors, and the like, mounted on the first side 120A during operation. The IC chips 133 generate heat and the temperatures of the IC chips 133 are higher than the other components on the PCB 120, or exceed their allowed maximum junction temperature (e.g., violate their specification) and thus the IC chips 133 become hot spots on the PCB 120. According to an embodiment of the disclosure, the IC chips 133 are the tallest components on the first side 120B of the PCB 120. When the IC chips 133 are in the close proximity to the planar side 110, such as in contact with the planar side 110, the planar side 110 suitably dissipates the heat generated by the IC chips 133 to cool down the IC chips 133. In an example, the planar side 110 is made of metal and is large enough to dissipate the heat emitted by the IC chips 133 to the environment, such as ambient air, and the like, and thus maintains a temperature, such as a junction temperature, and the like, of the IC chips 133 within an acceptable range.

In an example, the electronic system 100 is a network switching system 100. The network switching system 100 includes, for example, an Ethernet switch and controller chip and a plurality of transceiver chips. The switch and controller chip and the plurality of transceiver chips are implemented as surface mount chips that can be mounted on the first side 120A of the PCB 120. The planar side 110 of the enclosure 101 is made of a large metallic plate. The PCB 120 is attached to the planar side 110 via the attachment parts with the first side 120A facing, and in relatively close proximity to, the planar side 110. The surface mount chips have the largest height among the electronic components mounted on the first side 120A. During operation, in an example, the surface mount chips generate the most heat. In an example, the attachment parts are suitably configured such that the distance between the PCB 120 and the planar side 110 is substantially equal to the height of the surface mount chips. Thus, in an embodiment, the surface mount chips are thermally interfaced with the planar side 110, and the planar side 110 can effectively dissipate heat generated by the switch and controller chip and the transceiver chips on the first side 120A to maintain a junction temperature on the chips within an acceptable range. In an example, the surface mount chips are in close proximity to the planar side 110, but not in contact with the planar side 110. In another example, the surface mount IC chips are substantially in contact with the planar side 110. In still another example, some surface mount IC chips are in close proximity to the planar side 110, while other surface mount IC chips are substantially in contact with the planar side 110.

In an example, junction temperature measurements are performed on the IC chips of the network switching system 100 during operation. According to the measurements, in an embodiment, the junction temperature of the switch and controller chip is about 52° C., and the junction temperature of the transceiver chips is about 75° C. The junction temperatures of the network switching system 100 is more than 25° C. lower than corresponding junction temperatures of a comparison network switching device that uses conventional heat sinks on the active components.

FIG. 2 shows a diagram of the first side 120A of the printed circuit board (PCB) 120, i.e. the top side, in the network switching system 100 according to an embodiment of the disclosure. In the embodiment, the PCB 120 has two printed circuit layers that use minimal copper to reduce bill of material cost. Further, the PCB 120 requires single side assembly to further reduce manufacturing cost in an embodiment.

In the FIG. 2 example, IC chips are mounted on the first side 120A of the PCB 120. In the example, the network switching system 100 includes a plurality of IC chips, such as a switch and controller chip 131, a memory chip 132, six transceiver chips 133, and the like. The plurality of IC chips are active components that generally consume relatively large power, generate heat, and have relatively high temperature during operation. In an embodiment, the plurality of IC chips have substantially the same height above the surface of the first side 120A of the PCB 120. In an example, the power consumption of the IC chips in the network switching system 100 is over 18 W.

Further, in an embodiment, IC chips are generally designed to operate within a temperature range. When a temperature, such as a junction temperature on an IC chip is outside of the temperature range, transistors on the chip may not perform as expected, and may cause device malfunction.

According to an embodiment of the disclosure, the height of other components mounted on the first side 120A is equal to or smaller than the height of the components producing the greatest amount of heat, which in an embodiment are the IC chips. In an example, the IC chips are surface mount IC chips, and other components, such as resistors, capacitors, and the like mounted on the first side 120A are also surface mount devices that have about the same height as the IC chips. The other components consume less power than the surface mount IC chips, and generally have lower temperature than the surface mount IC chips during operation. Thus, in an example, when the PCB board 120A is assembled in the enclosure 101, the first side 120A can be disposed in close proximity to the planar side 110. In an example, the IC chips are in contact with the planar side 110 and the planar side 110 can be configured to act as a heat sink to dissipate the heat generated by the IC chips to maintain the junction temperature on the IC chips within an acceptable range.

In an embodiment, in a system design stage, the distance between the planar side 110 and the surface of the first side 120A is determined based on the height of the electronic components that are the hottest components during operation. Thus, any other components disposed on the first side 120A have a height that is equal to or lower than the height of the electronic components that are the hottest components during operation, According to an aspect of the disclosure, the determination of which component is the hottest component is made based on a ratio between a power consumption and a surface area of the component. In an embodiment, when the power consumption of an electronic component is larger than a power threshold, and the surface area of the electronic component is smaller than an area threshold, the electronic component is determined to be one of the hottest components.

Figure 3:
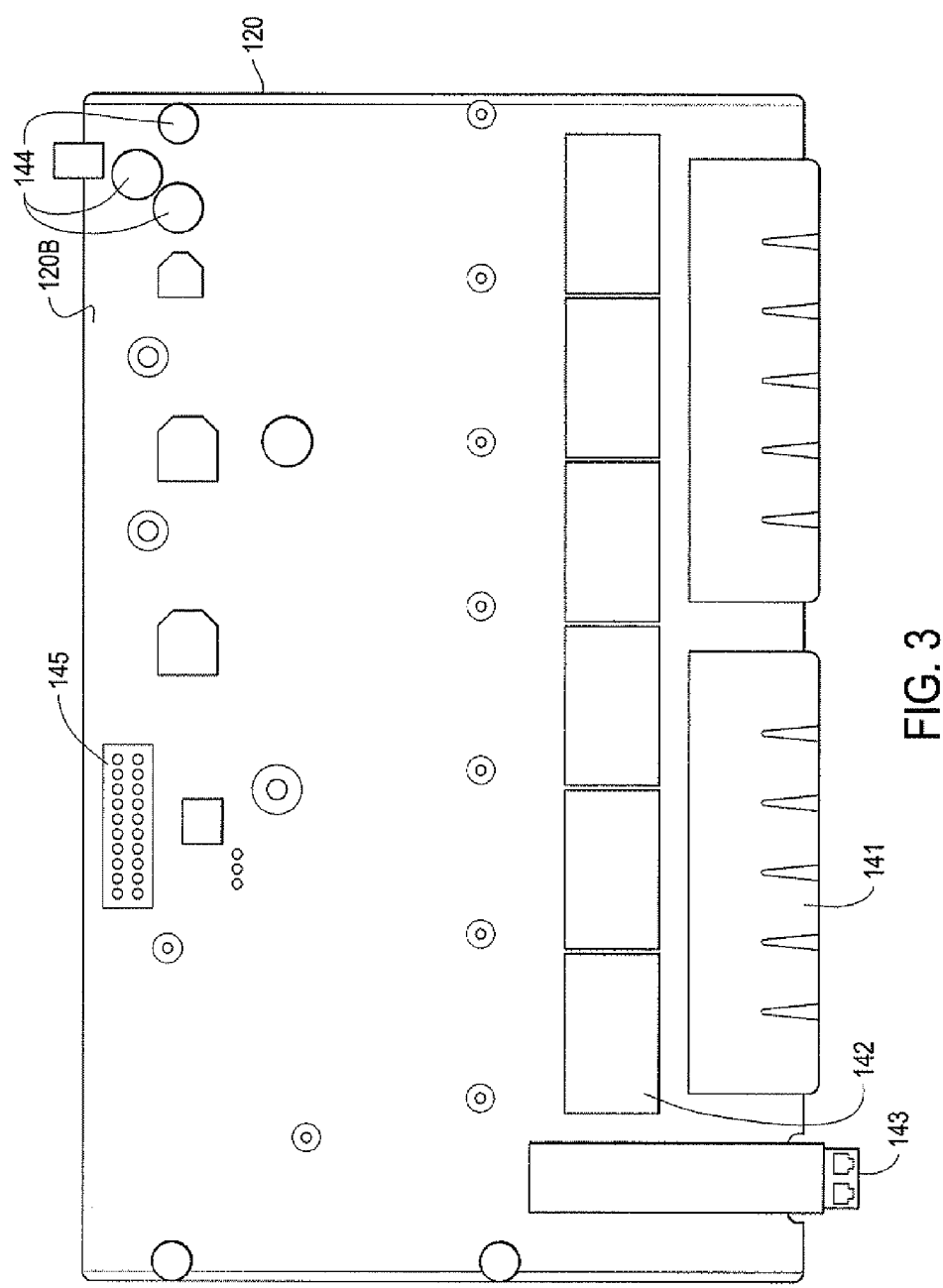
FIG. 3 shows a diagram of another side of the printed circuit board (PCB) 120 according to an embodiment of the disclosure.

FIG. 3 shows a diagram of the second side 120B of the printed circuit board 120 in the network switching system 100 according to an embodiment of the disclosure. In the FIG. 3 example, electronic components that have relatively large size, such as have higher height than the IC chips mounted on the first side 120A, are mounted on the second side 120B, In an embodiment, electronic components, whose height is larger than the IC chips mounted on the first side 120A, are mounted on the second side 120B. In an example, electrical connectors, such as Ethernet connectors 141, small form factor pluggable (SFP) cage connector 143, board connector 145 (e.g., joint task action group (JTAG), jumpers), and the like, that are higher than the surface mount IC chips mounted on the first side 120A, are mounted on the second side 120B. In another example, large size capacitors 144 that generally have a height higher than the surface mount IC chips are mounted on the second side 120B. In another example, magnetic modules 142, which are Ethernet cable interfaces for isolation and low common mode emission and are higher than the surface mount IC chips, are mounted on the second side 120B. In an embodiment, the tall components that are generally passive non-IC components consume less power and have lower temperature than the IC chips mounted on the first side 120A during operation.

According to an embodiment of the disclosure, the electronic components on the second side 120B are through-hole mount devices, and the electronic components on the first side 120A are surface mount devices. Thus, the PCB 120 can be assembled using single side assembly.

According to another embodiment of the disclosure, the second side 120B can also include surface mount devices, such as IC chips, and the like. In an embodiment, the IC chips mounted on the second side 12013 consumes less power than the IC chips mounted on the first side 120A, and have lower temperature than the IC chips mounted on the first side 120A. In another embodiment, the IC chips mounted on the second side 120B have larger surface area than the IC chips mounted on the first side 120A for heat dissipation such that the IC chips mounted on the second side 120B have lower temperature than the IC chips mounted on the first side 120A.

Figure 4:
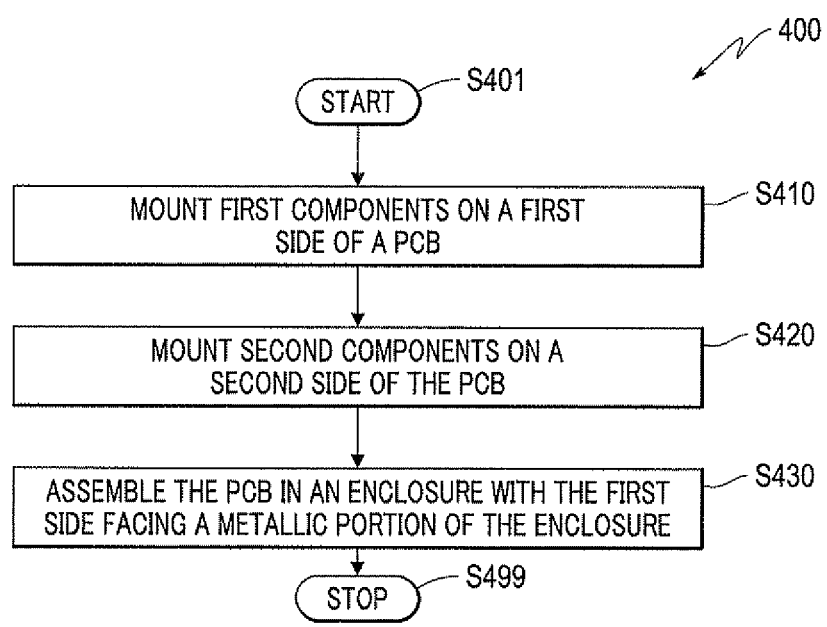
FIG. 4 shows a flow chart outlining a process 400 according to an embodiment of the disclosure.

FIG. 4 shows a flow chart outlining a process 400 to assemble the electronic system 100 according to an embodiment of the disclosure. The process starts at S401 and proceeds to S410.

At S410, first components are mounted on the first side 120A of the PCB 120. In an embodiment, the first components are active heat generating components, such as IC chips, and the like. Other components, such as passive, non- IC components, are also mounted on the first side 120A, in an embodiment. During operation of the electronic system 100, the power consumption of the first components is higher than the power consumption of the other components mounted on the first side 120A, and the temperature of the first components is higher than the temperature of the other components mounted on the first side 120A. The first components have larger height than or have about the same height as the other components mounted on the first side 120A. In an example, the first components are surface mount IC chips, and the other components include surface mount resistors, surface mount capacitors, and the like that have about the same height as the surface mount IC chips. At a printed circuit board assembly line, the surface mount IC chips, the surface mount resistors, and surface mount capacitors are suitably mounted on their respective positions on the first side 120A of the PCB 120.

At S420, second components are mounted on the second side 120B of the PCB 120. In an example, the second components include electronic components that have relatively large height, such as larger than the height of the IC chips on the first side 120A. In an embodiment, the second components are through-hole mount components that are hand assembled on the second side 120B at a printed circuit board assembly line.

At S430, the PCB 120 is assembled in the enclosure 101. The enclosure 101 includes the planar side 110 that is made of a metallic material to have relatively large heat dissipation capability. In an example, the PCB 120 is attached in the enclosure 101 that the IC chips on the first side 120A are generally in contact with the planar side 110. Thus, the planar side 110 acts as a heat sink to dissipate heat generated by the IC chips on the first side 120A. Then, the process proceeds to S499 and terminates.

It is noted that the process 400 can be suitably modified. In an example, the sequence of S410 and S420 can be swapped. In another example, S410 and S420 are performed in a first facility. Then, the PCB 120 is transported to a second facility, and S430 is performed at the second facility.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An electronic system, comprising:
 a printed circuit board (PCB), wherein:
  first electronic components are mounted on a first side of the PCB, the first electronic components have a power consumption that is greater than a power consumption threshold of the first electronic components and greater than power consumptions of second electronic components mounted on a second side of the PCB and have a height over the first side of the PCB that is higher than any other electronic components mounted on the first side of the PCB; and
  the second electronic components are mounted on the second side of the PCB, and at least one of the second electronic components has a height over the second side of the PCB that is higher than the height of the first electronic components; and
 a heat dissipating element adjacent to the first electronic components so as to provide a thermal coupling for dissipating heat generated by the first electronic components.

2. The electronic system of claim 1, wherein the heat dissipating element is a portion of an enclosure of the electronic system.

3. The electronic system of claim 2, wherein the enclosure is a fan-less enclosure.

4. The electronic system of claim 1, wherein the heat dissipating element is in contact with the first electronic components.

5. The electronic system of claim 1, wherein the heat dissipating element is a metallic plate.

6. The electronic system of claim 2, wherein the PCB is mounted onto the enclosure with the first side facing the heat dissipating element.

7. The electronic system of claim 1, wherein at least one of the first electronic components is an integrated circuits (IC) chip.

8. The electronic system of claim 1, wherein the first electronic components are surface-mount components.

9. The electronic system of claim 1, wherein the second electronic components are passive non-IC components.

10. A method, comprising:
 assembling a printed circuit board (PCB) with a heat dissipating element, wherein:
  first electronic components are mounted on a first side of the PCB, the first electronic components have a power dissipation that is greater than a power consumption threshold of the first electronic components and greater than power consumptions of second electronic components mounted on a second side of the PCB and have a height over the first side of the PCB that is higher than any other electronic components mounted on the first side of the PCB;
  the second electronic components are mounted on the second side of the PCB, and at least one of the second electronic components has a height over the second side of the PCB that is higher than the height of the first electronic components; and
  the first electronic components are adjacent to the heat dissipating element that provides a thermal coupling for dissipating heat generated by the first electronic components.

11. The method of claim 10, wherein assembling the PCB with the heat dissipating element further comprises:
 assembling the PCB with an enclosure of an electronic system that the heat dissipating element is a portion of the enclosure.

12. The method of claim 11, wherein assembling the PCB with the enclosure of the electronic system further comprises:
 assembling the PCB with a fan-less enclosure of the electronic system.

13. The method of claim 10, wherein assembling the PCB with the heat dissipating element further comprises:
 assembling the PCB with the first electronic components in contact with the heat dissipating element.

14. The method of claim 10, wherein assembling the PCB with the heat dissipating element further comprises:
 assembling the PCB with the heat dissipating element that is a metallic plate.

15. The method of claim 10, further comprising:
 mounting the first electronic components that are surface-mount components on the first side of the PCB.

16. The method of claim 10, further comprising:
 mounting the second electronic components that are passive non-IC components on the second side of the PCB.

17. An electronic system, comprising:
 a printed circuit board (PCB) mounted onto an enclosure of the electronic system, wherein:

first electronic components are mounted on a first side of the PCB, the first electronic components have a power consumption that is greater than a power consumption threshold of the first electronic components and have a height over the first side of the PCB that is higher than any other electronic components mounted on the first side of the PCB; and second electronic components are mounted on a second side of the PCB, and at least one of the second electronic components has a height over the second side of the PCB that is higher than the height of the first electronic components; and a portion of the enclosure as a heat dissipating element adjacent to the first electronic components so as to provide a thermal coupling for dissipating heat generated by the first electronic components and the first side facing the heat dissipating element.

18. A printed circuit board (PCB) mounted onto an enclosure of an electronic system, the PCB comprising:

first electronic components mounted on a first side of the PCB, the first electronic components having a power consumption that is greater than a power consumption threshold of the first electronic components and having a height over the first side of the PCB that is higher than any other electronic components mounted on the first side of the PCB;

second electronic components mounted on a second side of the PCB, at least one of the second electronic components having a height over the second side of the PCB that is higher than the height of the first electronic components; and a portion of the enclosure as a heat dissipating element adjacent to the first electronic components so as to provide a thermal coupling for dissipating heat generated by the first electronic components and the first side facing the heat dissipating element.

* * * * *